United States Patent
Sakai et al.

(10) Patent No.: US 8,076,649 B2
(45) Date of Patent: Dec. 13, 2011

(54) CHARGED PARTICLE BEAM WRITING APPARATUS AND OPTICAL AXIS DEVIATION CORRECTING METHOD FOR CHARGED PARTICLE BEAM

(75) Inventors: Michihiro Sakai, Shizuoka (JP); Ryoichi Kakehi, Shizuoka (JP); Kiyoshi Hattori, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 127 days.

(21) Appl. No.: 12/716,453

(22) Filed: Mar. 3, 2010

(65) Prior Publication Data

US 2010/0224789 A1    Sep. 9, 2010

(30) Foreign Application Priority Data

Mar. 6, 2009 (JP) ................................. 2009-052995

(51) Int. Cl.
*H01J 37/30* (2006.01)
*H01J 3/26* (2006.01)
*H01J 37/147* (2006.01)

(52) U.S. Cl. ................... 250/396 R; 250/397; 250/398; 250/492.2; 250/492.22

(58) Field of Classification Search .................. 250/299, 250/396 R, 397, 398, 492.1, 492.2, 492.22, 250/492.23, 492
See application file for complete search history.

(56) References Cited

U.S. PATENT DOCUMENTS

| 7,084,411 B2 * | 8/2006 | Lammer-Pachlinger et al. ........................ 250/492.1 |
| 7,173,262 B2 * | 2/2007 | Hosoda et al. ........... 250/492.22 |
| 2005/0087701 A1 * | 4/2005 | Lammer-Pachlinger et al. ........................ 250/492.22 |

FOREIGN PATENT DOCUMENTS

JP        11-150055        6/1999

* cited by examiner

*Primary Examiner* — Bernard E Souw
(74) *Attorney, Agent, or Firm* — Oblon, Spivak, McClelland, Maier & Neustadt, L.L.P.

(57) ABSTRACT

A charged particle beam writing apparatus includes a stage on which a target object is placed; an emitting unit configured to emit a charged particle beam to the stage side; a blocking unit arranged between the emitting unit and the stage and configured to block the charged particle beam emitted; a deflector having electrodes through which a current flows by applying a voltage and configured to deflect the charged particle beam passing between the electrodes onto the blocking unit by applying a predetermined voltage across the electrodes; an optical axis adjusting unit configured to correct optical axis deviation of the charged particle beam generated by continuously repeating irradiation (beam-ON) of the charged particle beam on a target object and blocking (beam-OFF) of the beam by applying a two-step voltage to the deflector; and a control unit configured to control the optical axis adjusting unit such that an amount of the optical axis deviation is corrected.

10 Claims, 6 Drawing Sheets

CHARGED PARTICLE BEAM WRITING APPARATUS AND OPTICAL AXIS DEVIATION CORRECTING METHOD FOR CHARGED PARTICLE BEAM

CROSS-REFERENCE TO RELATED APPLICATION

This application is based upon and claims the benefit of priority from prior Japanese Patent Application No. 2009-052995 filed on Mar. 6, 2009 in Japan, the entire contents of which are incorporated herein by reference.

BACKGROUND OF THE INVENTION

1. Field of the Invention

The present invention relates to a charged particle beam writing apparatus and an optical axis deviation correcting method for a charged particle beam, for example, correction for optical axis deviation of an electron beam in a writing apparatus which forms a pattern on a target object while variably shaping the electron beam.

2. Related Art

A lithography technique which takes a part of the development of miniaturization of semiconductor devices is only a process, in which a pattern is generated, in semiconductor manufacturing processes and is very important. In recent years, with the advancement in integration density of an LSI, circuit line widths required for semiconductor devices are miniaturized year by year. In order to form desired circuit patterns on the semiconductor devices, precise original patterns (to be also referred to as a reticle or a mask) are required. In this case, an electron beam writing technique has an essentially excellent resolution, and is used in production of precise original patterns.

Figure 8:
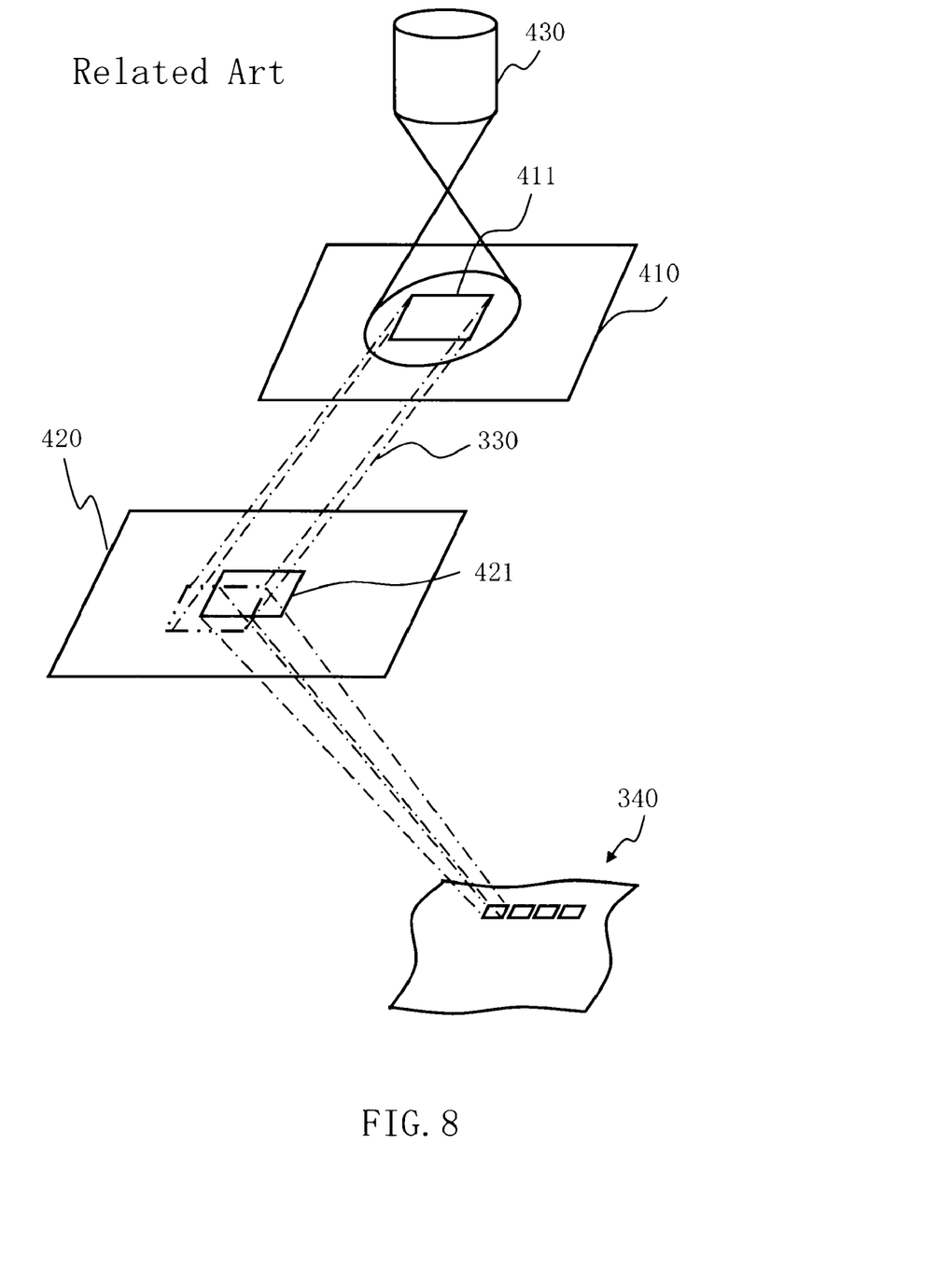
FIG. 8 is a conceptual diagram for explaining an operation of a variable-shaped electron beam writing apparatus.

FIG. 8 is a conceptual diagram for explaining an operation of a variable-shaped electron beam writing apparatus. The variable-shaped electron beam (EB) writing apparatus operates as follows. An oblong, for example, rectangular opening 411 to shape an electron beam 330 is formed in a first aperture plate 410. A variable-shaped opening 421 to shape the electron beam 330 having passed through the opening 411 of the first aperture plate 410 into a desired oblong shape is formed in a second aperture plate 420. The electron beam 330 irradiated from the charged particle source 430 and having passed through the opening 411 of the first aperture plate 410 is deflected by a deflector, passes through a part of the variable-shaped opening 421 of the second aperture plate 420, and is irradiated on a target object 340 placed on a stage continuously moving in one predetermined direction (for example, an X direction). More specifically, an oblong shape which can pass through both the opening 411 of the first aperture plate 410 and the variable-shaped opening 421 of the second aperture plate 420 is written in a write region of the target object 340 placed on the stage continuously moving in the X direction. A scheme which causes an electron beam to pass through both the opening 411 of the first aperture plate 410 and the variable-shaped opening 421 of the second aperture plate 420 to form an arbitrary shape is called a variable-shaping scheme.

In this case, in the electron beam writing apparatus, an operation of irradiating a beam on a target object and an operation of cutting a beam not to irradiate a beam are performed. In the operation of irradiating a beam on a target object, the electron beam is caused to pass through an opening of a blanking aperture plate. In the operation of cutting a beam not to irradiate the beam, an electron beam is deflected by a blanker to a blocking portion of the blanking aperture plate to block the electron beam. These operations are repeatedly performed to form a pattern on a target object. Since the number of figures of a formed pattern increases with the miniaturization of semiconductor devices, a blanking mechanism which can perform the operations at a high speed is required to realize high productivity. In order to realize a high-speed operation, a method which connects terminal resistors to electrodes of the blanker to match impedances and suppresses a reflected wave of a blanking signal in application of a voltage is known (for example, see Published Unexamined Japanese Patent Application No. 11-150055).

Before a pattern is formed, an optical axis of an electron beam must be adjusted. However, in a conventional technique, the optical axis of the electron beam is adjusted such that a voltage applied to a blanker is set to a certain stationary state (in this case, 0 V) to make a beam-ON state so as to cause an electron beam to pass through a center of an opening of a blanking aperture plate. When a high-frequency pulse serving as a blanking signal to control ON/OFF state of an electron beam is applied across electrodes of the blanker having the above configuration by using the writing apparatus having the optical axis adjusted as described above, the optical axis of the electron beam which should have been adjusted may be disadvantageously deviated. This phenomenon may be caused by the following factor. That is, for example, when terminal resistors are attached to blanking electrodes to suppress a reflected wave, a current is concentrated on a surface of each of the electrodes by a skin effect at the corresponding electrode when a high-frequency pulse is applied across the electrodes. For this reason, at a moment an applied voltage of the high-frequency pulse is made zero, a residual current having flowed on the surfaces of the electrodes generates an eddy current to generate a magnetic field.

When the optical axis of the electron beam is deviated, even though the beam is turned on to make a state in which the electron beam can pass through the blanking aperture plate, the electron beam is partially cut by the blanking aperture plate to decrease a current transmittance. For this reason, a dose of an electron beam reaching a target object may decrease. The decrease in dose of the electron beam causes a problem such as deterioration of pattern dimensional accuracy.

Furthermore, when the optical axis of the electron beam is deviated, the electron beam does not pass through the center of an electron lens such as an objective lens through which the electron beam were to pass thereafter to also cause an on-axis astigmatism, a deflection astigmatism, and a deflection distortion.

As described above, when a high-frequency pulse is applied across the electrodes of the blanker having the above configuration, the optical axis of the electron beam which should have been adjusted is disadvantageously deviated. According to an experiment by the inventors, with respect to this deviation, an amount of deviation becomes notable according to an irradiation cycle ratio. As described above, when the optical axis of the electron beam is deviated, a problem such as deterioration in pattern dimensional accuracy, an on-axis astigmatism, a deflection astigmatism, or a deflection distortion may be caused. However, conventionally, a method of solving the problem has not been established yet.

BRIEF SUMMARY OF THE INVENTION

It is an object of the present invention to provide a method and apparatus which corrects a deviation of an optical axis of a beam even though the beam is turned ON/OFF at a high speed.

In accordance with one aspect of the present invention, a charged particle beam writing apparatus includes a stage on which a target object is placed; an emitting unit configured to emit a charged particle beam to the stage side; a blocking unit arranged between the emitting unit and the stage and configured to block the charged particle beam emitted; a deflector having electrodes through which a current flows by applying a voltage and configured to deflect the charged particle beam passing between the electrodes onto the blocking unit by applying a predetermined voltage across the electrodes; an optical axis adjusting unit configured to correct optical axis deviation of the charged particle beam generated by continuously repeating irradiation (beam-ON) of the charged particle beam on a target object and blocking (beam-OFF) of the beam by applying a two-step voltage to the deflector; and a control unit configured to control the optical axis adjusting unit such that an amount of the optical axis deviation is corrected.

In accordance with another aspect of the present invention, a optical axis deviation correcting method for a charged particle beam, includes adjusting an optical axis of the charged particle beam in a state in which an application voltage to a blanker having electrodes through which a current flows by applying a voltage is set to a voltage for beam-ON; and after the optical axis of the charged particle beam is adjusted, correcting an amount of optical axis deviation of the charged particle beam by adjusting a position of the optical axis while turning ON/OFF the beam by repeating two-step voltage application to the blanker.

DETAILED DESCRIPTION OF THE INVENTION

Embodiment 1

In an embodiment, a configuration using an electron beam as an example of a charged particle beam will be described below. The charged particle beam is not limited to an electron beam, and a beam such as an ion beam using charged particles may be used.

Figure 1:
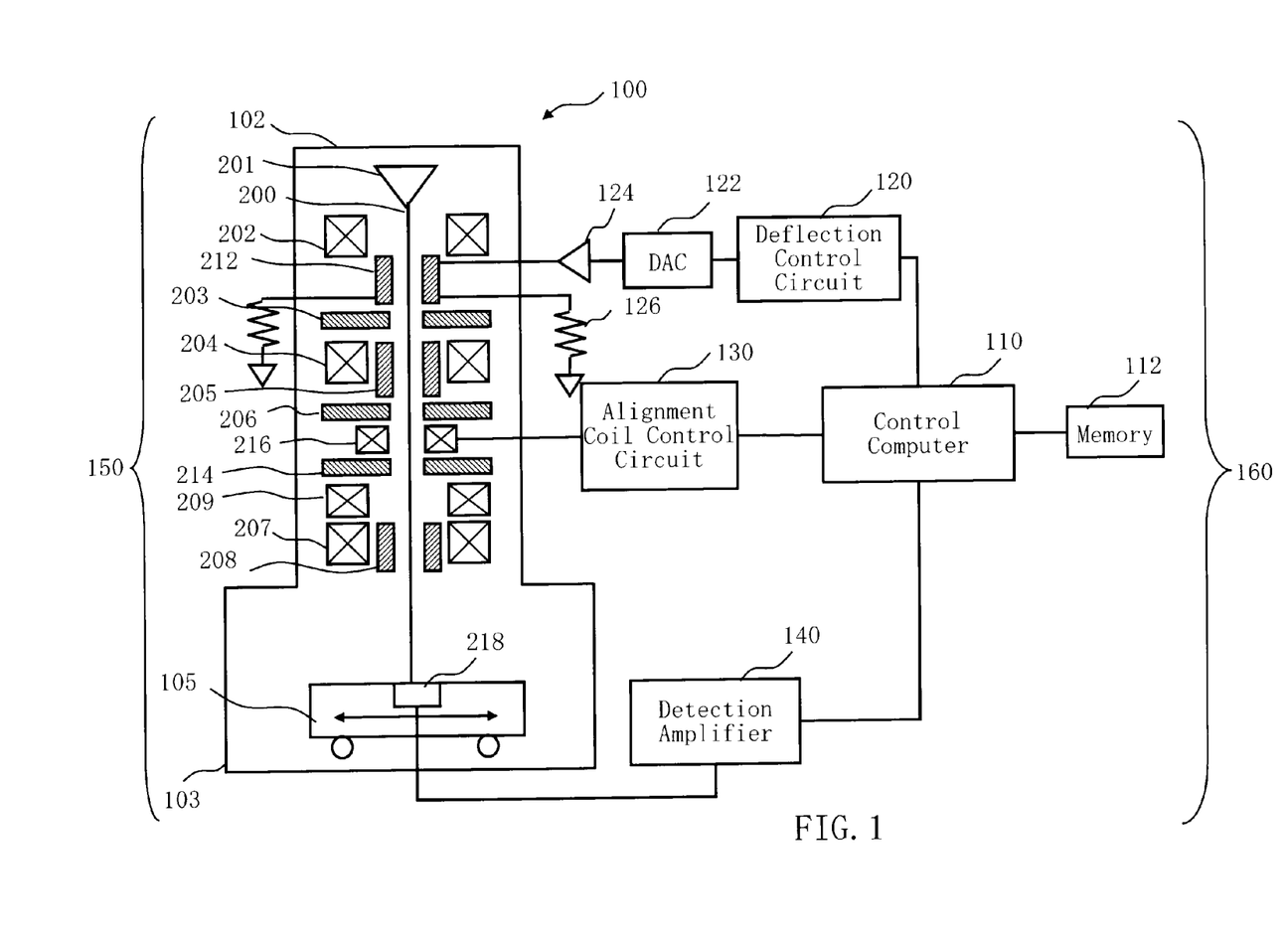
FIG. 1 is a conceptual diagram showing a configuration of an electron beam writing apparatus according to Embodiment 1.
Figure 2:
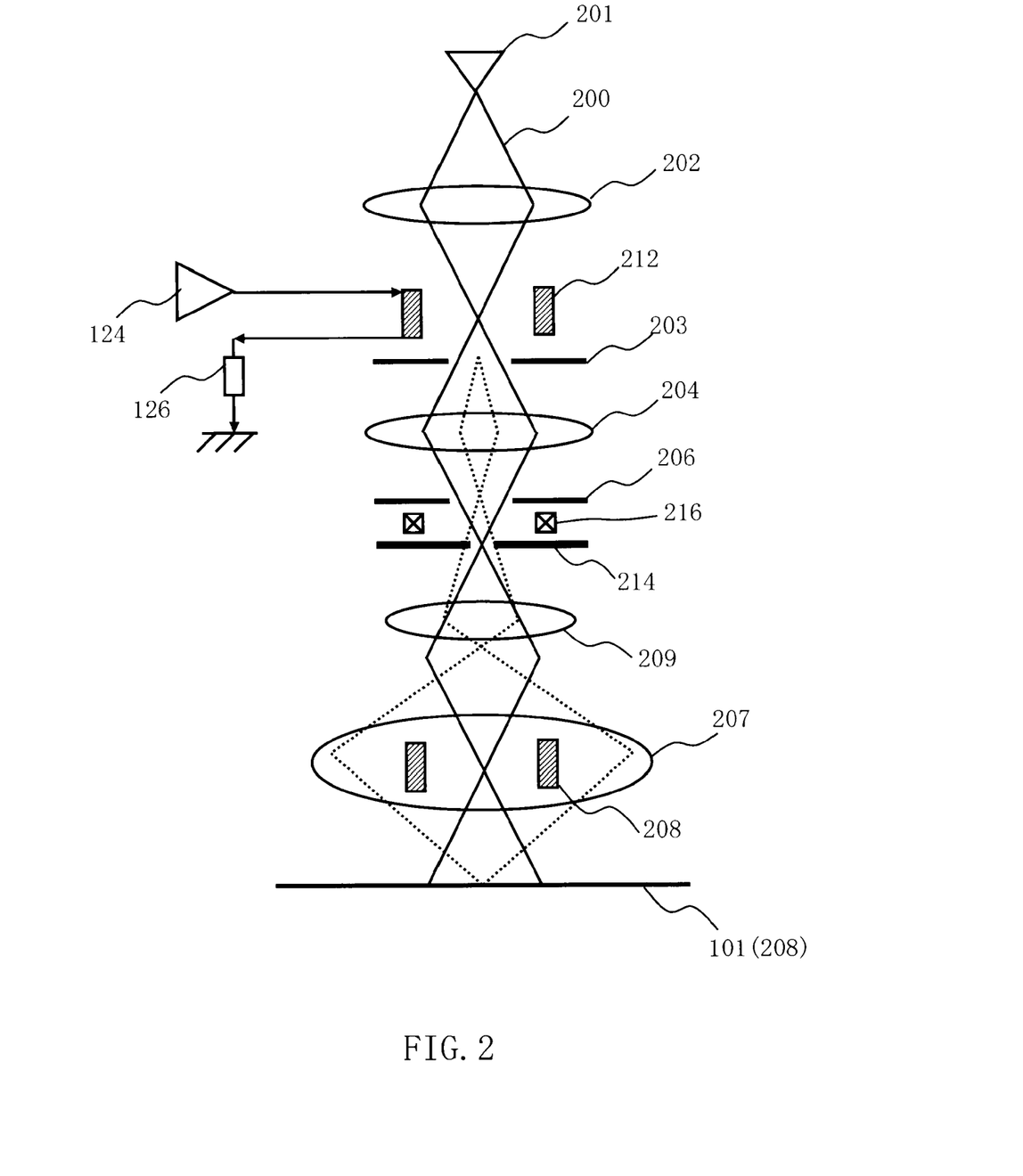
FIG. 2 is a conceptual diagram showing a configuration of the electron beam writing apparatus according to Embodiment 1.

FIGS. 1 and 2 are conceptual diagrams showing a configuration of an electron beam writing apparatus according to Embodiment 1. In FIGS. 1 and 2, a writing apparatus 100 includes a write unit 150 and a control unit 160. The writing apparatus 100 serves as an example of a charged particle beam writing apparatus. The write unit 150 has an electron lens barrel 102 and a write chamber 103. In the electron lens barrel 102, an electron gun assembly 201 (emitting unit), an illumination lens 202, a blanker 212, a first aperture plate 203, a projection lens 204, a deflector 205, a second aperture plate 206, an alignment coil 216, a blanking aperture plate 214 (regulation aperture plate), a reducing lens 209, an objective lens 207, and a deflector 208 are arranged. In the write chamber 103, an X-Y stage 105 is arranged. On the X-Y stage 105, a Faraday cup 218 is arranged. In pattern forming, a target object as an object of pattern forming is placed at a position different from the position where the Faraday cup 218 is arranged. The blanker 212 is configured by one pair of electrodes, and resistors 126 (terminal resistors) are respectively connected to the electrodes across which the voltage is applied, and the other connection ends of the resistors 126 are earthed (grounded). The electrodes are not limited to one pair of electrodes. The blanker 212 may have paired counter electrodes between which the electron beam 200 passes, and may have four or more electrodes. The resistors 126 suppress a reflected wave of the applied voltage.

As an arrangement order, for example, the electron gun assembly 201, the blanker 212, the first aperture plate 203, the deflector 205, the second aperture plate 206, the alignment coil 216, the blanking aperture plate 214, the objective lens 207, the deflector 208, and the X-Y stage 105 are arranged in this order from the top. The objective lens 207 and the deflector 208 may be arranged in the other order or may be arranged at the same position. The position of the blanking aperture plate 214 may be arbitrarily changed on the downstream side of the blanker 212. The electron lens barrel 102 and the write chamber 103 in which the X-Y stage 105 is arranged are vacuumed by a vacuum pump (not shown) to be set in a vacuum atmosphere having a pressure lower than the atmospheric pressure.

The control unit 160 includes a control computer 110, a memory 112, a deflection control circuit 120, a digital-analog converter (DAC) 122, an amplifier 124, an alignment coil control circuit 130, and a detection amplifier 140. The control computer 110, the memory 112, the deflection control circuit 120, the alignment coil control circuit 130, and the detection amplifier 140 are connected to each other by a bus (not shown). The deflection control circuit 120 is connected to the blanker 212 through the DAC 122 and the amplifier 124. The alignment coil control circuit 130 is connected to the alignment coil 216. The detection amplifier 140 is connected to the Faraday cup 218.

In FIGS. 1 and 2, a part except for a configuration part required for explaining Embodiment 1 will not be described. The writing apparatus 100 generally includes other necessary configurations as a matter of cause. In FIG. 2, a flow of the electron beam 200 is shown in detail.

The electron beam 200 emitted from the electron gun assembly 201 illuminates the entire first aperture plate 203 having an oblong, for example, rectangular hole (opening of the aperture plate) by the illumination lens 202. In this case, the electron beam 200 is shaped into an oblong, for example, a rectangle first. The electron beam 200 of the first aperture plate image having passed through the first aperture plate 203 is projected on the second aperture plate 206 by the projection lens 204. A position of the first aperture plate image on the second aperture plate 206 is controlled by the deflector 205 to make it possible to change a beam shape and a beam size. The electron beam 200 of the second aperture plate image having passed through the second aperture plate 206 passes through the opening of the blanking aperture plate 214 and is reduced at a predetermined magnification by the reducing lens 209. Thereafter, the electron beam 200 is focused by the objective lens 207, deflected by the deflector 208, and irradiated on the target object 101 applied with a resist on the X-Y stage 105 which is movably arranged. In this manner, the electron beam 200 of the second aperture plate image is irradiated on a desired position to form a desired pattern on the target object 101. The opening of the blanking aperture plate 214 is formed to have such a size that the entire beam cannot pass through the opening unless the optical axis is substantially adjusted to an ideal position.

In a beam-ON state, a voltage of the blanker 212 is set to 0 V, the electron beam 200 emitted from the electron gun assembly 201 illuminates the entire first aperture plate by the illumination lens 202 as shown in FIG. 1 or 2. The electron beam 200 is irradiated on a desired position of the target object 101 through the path described above.

In contrast to this, in a beam-OFF state (blanking voltage is Vb), a blanking signal output from the deflection control circuit 120 is converted into an analog signal (voltage) by the DAC 122, amplified by the amplifier 124, and applied to the blanker 212. Voltages having opposite signs to each other are applied to the counter electrodes of the blanker 212, respectively. The counter electrodes may have ground potentials. In Embodiment 1, since the electrodes of the blanker 212 are grounded through the resistors 126, the voltages are applied to the electrodes to cause current flow through the electrodes. When a voltage is applied to the blanker 212, the electron beam 200 is deflected and irradiated on a blocking portion except for the opening of the blanking aperture plate 214 on the downstream side. In this manner, the electron beam is cut by the blanking aperture plate 214 and, thereafter, is not irradiated.

When the beam is turned ON/OFF, one shot is irradiated on a target object surface, and the electron beam 200 of a necessary dose can be shot on a necessary position. With this configuration, a variable shaped (VSB-type) EB writing apparatus can be obtained.

Figure 3:
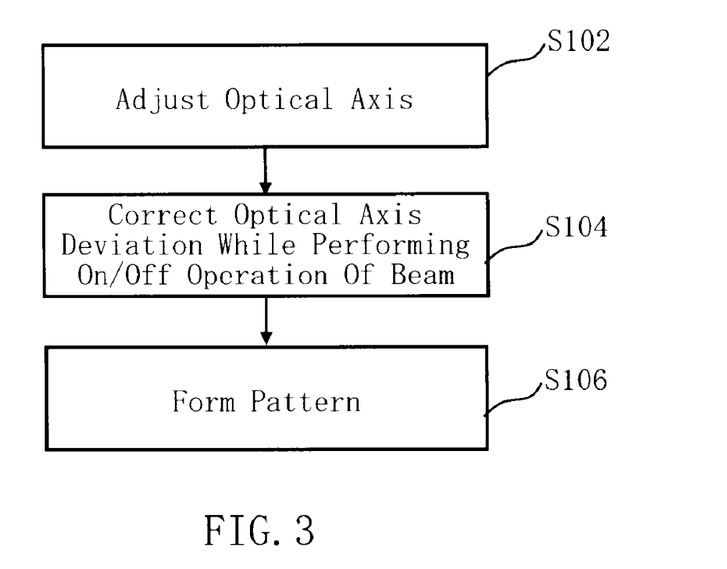
FIG. 3 is a flow chart showing main steps in an optical axis deviation correcting method for a charged particle beam in Embodiment 1.

FIG. 3 is a flow chart showing main steps in an optical axis deviation correcting method for a charged particle beam in Embodiment 1. In FIG. 3, in the optical axis deviation correcting method for a charged particle beam according to Embodiment 1, a series of steps such as an optical axis adjusting step (S102) and an optical axis deviation correcting step (S104) are performed. After correction of the optical axis deviation of the charged particle beam is finished, a pattern forming step (S106) is performed.

As the optical axis adjusting step (S102), a voltage (in this case, 0 V) which makes a beam in an ON state is applied to the blanker 212 to adjust the optical axis of the electron beam 200 to cause the beam to pass through an aperture plate center. For example, the X-Y stage 105 is firstly moved to locate the Faraday cup 218 on an ideal optical axis. The deflector 205 is adjusted to cause the entire electron beam 200 of the first aperture plate image having passed through the first aperture plate 203 to pass through the opening of the second aperture plate 206, and the electron beam 200 having passed through the opening is irradiated on the Faraday cup 218. The adjustment is performed such that the optical axis of the electron beam 200 is moved by the alignment coil 216 (optical axis adjusting unit) to maximize an amount of current detected by the Faraday cup 218. The alignment coil 216 is controlled by the alignment coil control circuit 130 (control unit).

Figure 4:
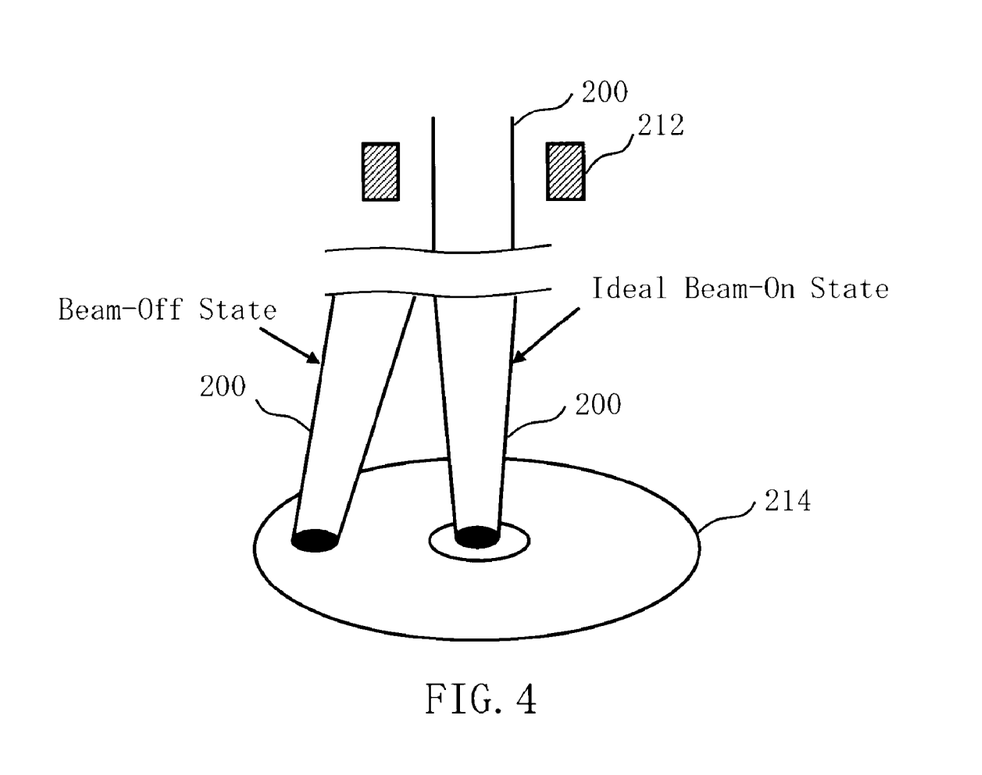
FIG. 4 is a conceptual diagram showing a state of an optical axis of an electron beam in Embodiment 1.

FIG. 4 is a conceptual diagram showing a state of an optical axis of an electron beam in Embodiment 1. As shown in FIG. 4, the electron beam 200 having the adjusted optical is adjusted to pass through a center of the opening of the blanking aperture plate 214 by applying a voltage (in this case, 0 V) which makes the beam in an ON state to the blanker 212. The adjustment is performed such that at least an entire beam irradiated on the blanking aperture plate 214 passes through the center of the opening of the blanking aperture plate 214. In a state in which the voltage Vb is applied to the blanker 212 (beam-OFF state), the entire beam is irradiated on the blocking portion of the blanking aperture plate 214 and deflected not to pass through the opening. When this state can be maintained, a pattern can be formed without any change.

Figure 5A:
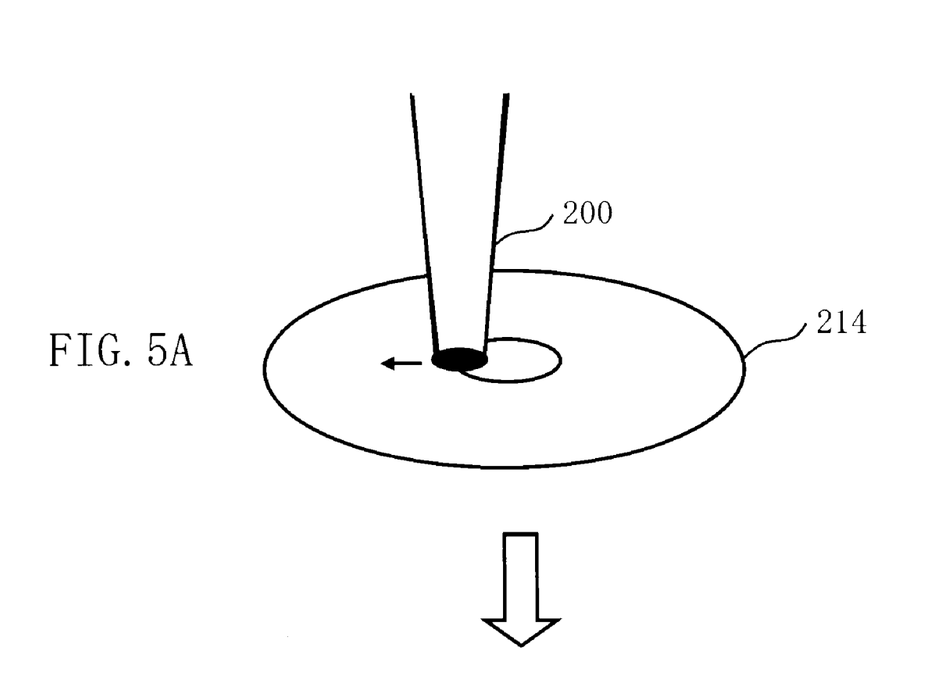
FIGS. 5A and 5B are conceptual diagrams respectively showing a state in which an optical axis of the electron beam in Embodiment 1 is deviated and a state in which the deviation is corrected.
Figure 5B:
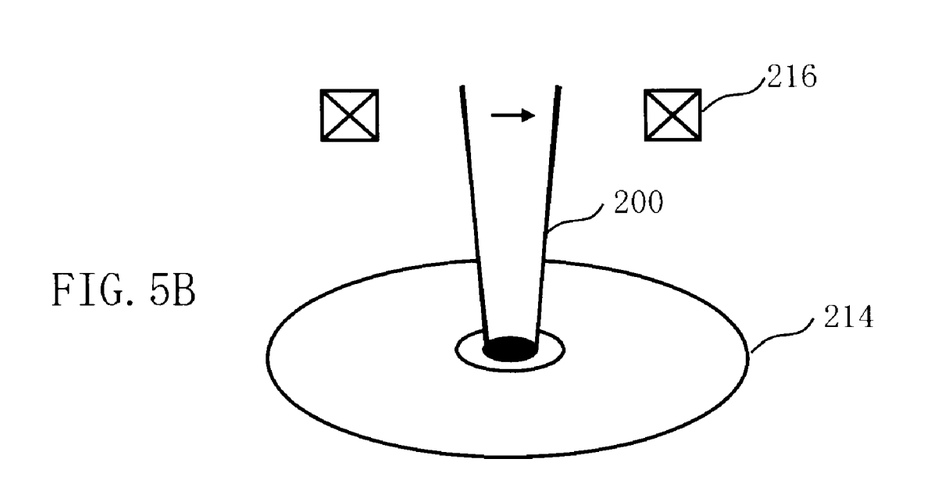

FIGS. 5A and 5B are conceptual diagrams respectively showing a state in which an optical axis of an electron beam in Embodiment 1 is deviated and a state in which the deviation is corrected. As described above, even after the optical axis is adjusted as described above, when a high-frequency pulse is applied across the electrodes of the blanker 212, as shown in FIG. 5A, the optical axis of the electron beam 200 which should have been adjusted is deviated. For this reason, in Embodiment 1, the deviation of the optical axis is corrected. For example, the X-Y stage 105 is moved in advance such that the Faraday cup 218 is located on an ideal optical axis. The deflector 205 is adjusted to cause the entire electron beam 200 of the first aperture plate image having passed through the first aperture plate 203 to pass through the opening of the second aperture plate 206. The respective configurations are controlled in advance such that the electron beam 200 having passed through the blanking aperture plate 214 is irradiated on the Faraday cup 218 in a beam-ON state.

As the optical axis deviation correcting step (S104), after the optical axis of the electron beam 200 is adjusted, an amount of optical axis deviation of the electron beam 200 is corrected by adjusting the optical axis while repeatedly turning ON/OFF application of a voltage to the blanker 212. More specifically, a high-frequency pulse for beam-ON/OFF is applied across the electrodes of the blanker 212 under the same operation conditions as those when the pattern is formed. The detection amplifier 140 (an example of a measuring unit) measures current values of the electron beam 200 having passed through the blanking aperture plate 214 (blocking portion) and irradiated on the Faraday cup 218 (an example of the measuring unit) when the application of the voltage to the blanker 212 is repeated to turn ON/OFF the beam in a predetermined period of time. In this manner, the current values of the electron beam 200 reaching the X-Y stage 105 is measured. The measured current values is output to the control computer 110. The current values are similarly measured while moving a position of the electron beam 200 by the alignment coil 216. As shown in FIG. 5A, when a part of the electron beam 200 is blocked by the blanking aperture plate 214, a dose of the electron beam 200 irradiated on the Faraday cup 218 decreases. For this reason, whether an irradiation position of the electron beam 200 is deviated can be recognized by measuring the current values of the electron beam 200 irradiated on the Faraday cup 218. With an instantaneous current values, optical axis deviation cannot be easily detected. However, in Embodiment 1, an average of amounts of current in a predetermined period of time is used as a measured value of the current value, whereby an error can be suppressed. The control computer 110 receives an output from the detection amplifier 140 to output a control signal to the alignment coil control circuit 130 such that the position of the optical axis of the electron beam 200 is a position where an accumulated current value is maximum. The alignment coil control circuit 130 (control unit) outputs a control signal such that the optical axis of the electron beam 200 is moved to a position where the amount of current measured by the Faraday cup 218 becomes larger. The alignment coil 216 receives the control signal from the alignment coil control circuit 130 to move the position of the optical axis of the electron beam 200 according to the control signal. In this manner, the alignment coil control circuit 130 controls the alignment coil 216 (optical axis adjusting unit) to move the position of the optical axis of the electron beam 200 by the alignment coil 216 to a position where the current value is maximum. The position where the current value is maximum, should be a position where the electron beam 200 is not blocked by the blanking aperture plate 214 as shown in FIG. 5B. In other words, on the basis of a signal from the control computer 110, the alignment coil control circuit 130 (control unit) controls the alignment coil 216 such that the amount of optical axis deviation is corrected by the alignment coil 216. In this manner, the deviated optical axis can be corrected.

It is explained here that whether the irradiation position of the electron beam 200 is deviated is recognized by measuring the current value by the Faraday cup 218. However, the way of adjusting the position is not limited thereto. For example, it may be also preferable that a detector (not shown) is arranged above the blanking aperture plate 214 to detect reflected electrons blocked and reflected by the blanking aperture plate 214, and the position of the optical axis of the electron beam 200 is moved by the alignment coil 216 to a position where the number of reflected electrons is minimum.

Figures 6A, 6B:
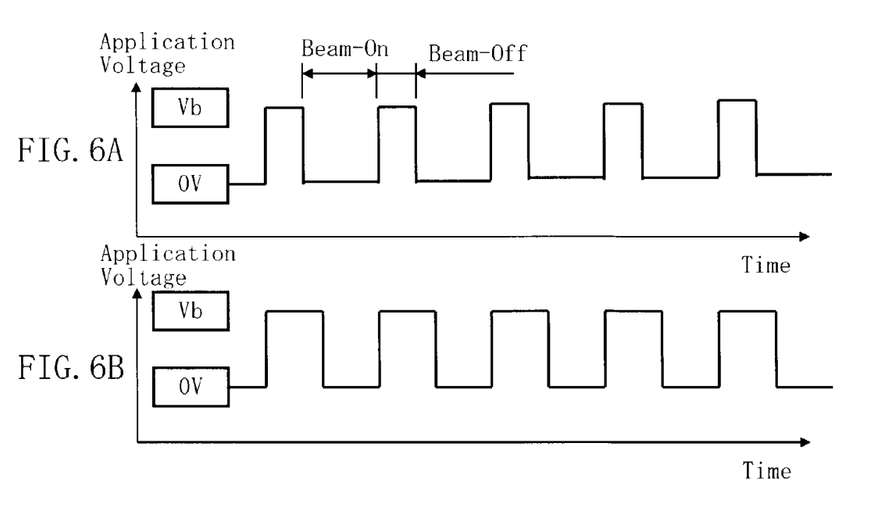
FIGS. 6A and 6B are flow diagrams for explaining irradiation cycle ratios in Embodiment 1.

FIGS. 6A and 6B are flow diagrams for explaining irradiation cycle ratios in Embodiment 1. The irradiation cycle ratio is defined as a ratio of a beam-ON time to a beam-OFF time in every shot. For example, in a setting shown in FIG. 6A, a beam-ON time (first time) in which an application voltage to the blanker 212 to be in beam-ON state is set to 0 V and a beam-OFF time (second time) in which an application voltage to the blanker 212 to be in beam-OFF state is set to Vb are shown to have a ratio of 7:3. The irradiation cycle ratio in this case is 0.3 (i.e., 30%). On the other hand, in a setting shown in FIG. 6B, a ratio of a beam-ON time to a beam-OFF time is a ratio of 1:1, which means an irradiation cycle ratio=0.5 (i.e., 50%). When an eddy current is present, a dose changes depending on the irradiation cycle ratio. For this reason, it is required to calculate an average irradiation cycle ratio for the sensitivity of a resist used when a pattern is formed in advance, and to adjust an alignment value depending on the irradiation cycle ratio.

Figure 7:
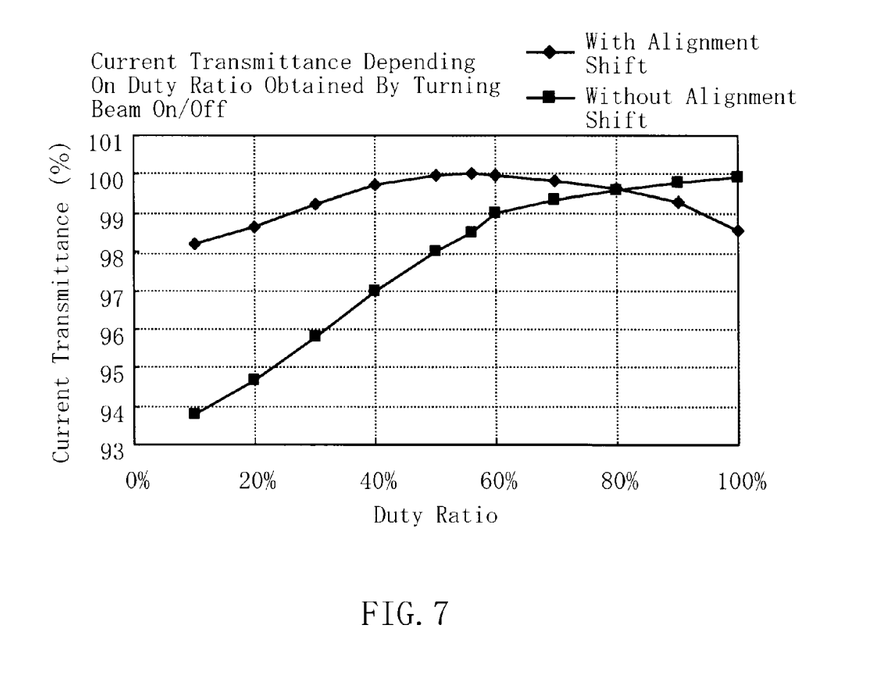
FIG. 7 is a graph showing a relationship between a current transmittance and an irradiation cycle ratio when a high-frequency pulse is applied to a blanker through which a current flows in Embodiment 1.

FIG. 7 is a graph showing a relationship between a current transmittance and an irradiation cycle ratio when a high-frequency pulse is applied to a blanker through which a current flows in Embodiment 1. In FIG. 7, when optical axis deviation in Embodiment 1 is not corrected as shown by "without alignment shift", the closer the irradiation cycle ratio gets to 100% (the longer the beam-ON time is), the closer the current transmittance gets to 100%. More specifically, it is understood that optical axis deviation when a high-frequency pulse is applied to the blanker 212 is small. In contrast to this, the closer the irradiation cycle ratio gets to 0% (the longer the beam-OFF time is), the lower the current transmittance is. More specifically, it is understood that optical axis deviation when the high-frequency pulse is applied to the blanker 212 is large. FIG. 7 shows an example in which the deviation is corrected such that the current transmittance becomes 100% when the irradiation cycle ratio is 50%, as the optical axis deviation correcting step (S104). In other words, FIG. 7 shows an example in which correction is performed to eliminate optical axis deviation of the electron beam 200 when the irradiation cycle ratio is 50%.

In this case, since the irradiation cycle ratio is changed depending on the sensitivity of the resist used when a pattern is formed, in Embodiment 1, a plurality of control values to control the alignment coil 216 for correcting the optical axis deviation are defined in advance. The plurality of control values may be stored in the memory 112 or a storage device (not shown). The graph shown in FIG. 7 may be obtained through an experiment, and control values that make a current transmittance 100% at a desired duty ratio may be obtained for each duty ratio in advance.

When a low-sensitive resist is selected on a target object serving as an object on which a pattern is to be formed, an irradiation cycle ratio matched with the resist sensitivity is calculated, and a control value corresponding to the ratio is read from the memory. The alignment coil 216 is controlled using the read control value when a pattern is formed, whereby alignment correction is performed. When this control is performed, a control value at which a transmittance of the electron beam 200 is maximum is used, and pattern forming can be more efficient than that without correction.

In contrast to this, when a high-sensitive resist which is exposed at a sensitivity higher than a reference resist is selected, a control value corresponding to an irradiation cycle ratio is read from a memory, and the alignment coil 216 is controlled using the read control value when a pattern is formed, whereby alignment correction is performed similarly. When this control is performed, a control value at which the transmittance of the electron beam 200 is maximum is used, and pattern forming can be more efficient than that without correction.

As described above, a plurality of control values for controlling the alignment coil 216 are defined, and an exposure changes depending on types of resists when a pattern is actually formed. For this reason, an average irradiation cycle ratio determined for a resist is obtained, and control is performed with a control value depending on the ratio set.

In this manner, according to Embodiment 1, even though a beam is turned ON/OFF at a high speed, optical axis deviation of the beam can be corrected.

As described above, optical axis deviation when a high-frequency pulse is applied to the blanker 212 is corrected to make it possible to prevent a part of the electron beam 200 from being cut by the blanking aperture plate 214 in a beam-ON state. As a result, deterioration in pattern dimensional accuracy can be suppressed.

Furthermore, by similarly correcting optical axis deviation, it is possible to prevent the electron beam 200 from not passing through a center of an electron lens such as the objective lens 207. As a result, an on-axis astigmatism, a deflection astigmatism, and a deflection distortion can be suppressed.

After the optical axis deviation when a high-frequency pulse is applied to the blanker 212 is corrected, as a pattern forming step (S106), the write unit 150 forms a predetermined pattern on the target object 101 on which a resist is coated. In this manner, a pattern having accurate dimensions can be obtained.

When optical axis adjustment is performed without applying a high-frequency pulse to the blanker 212 (when the optical axis adjusting step (S102) is performed), the optical axis may be moved back corresponding to an amount that is corrected in the optical axis deviation correcting step (S104) in advance as a matter of course.

The embodiment has been explained with reference to the concrete examples. However, the present invention is not limited to the concrete examples. A VSB-type writing apparatus is explained here. However, the present invention can also be applied to any writing apparatus using a deflector having electrodes through which a current flows.

Although parts such as an apparatus configuration and a control method which are not directly required for the explanation of the present invention are not described, a required apparatus configuration or a required control method can be arbitrarily selected and used. For example, although a configuration of a control unit which controls the writing apparatus 100 is not described, a required control unit configuration can be arbitrarily selected and used as a matter of course.

All charged particle beam writing apparatuses, all writing methods, and all optical axis deviation correcting methods for a charged particle beam each of which includes the elements of the present invention and can be arbitrarily changed in design by a person skilled in the art are included in the spirit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   a stage on which a target object is placed;
   an emitting unit configured to emit a charged particle beam to the stage side;
   a blocking unit arranged between the emitting unit and the stage and configured to block the charged particle beam emitted;
   a deflector having electrodes through which a current flows by applying a voltage and configured to deflect the charged particle beam passing between the electrodes onto the blocking unit by applying a predetermined voltage across the electrodes;
   an optical axis adjusting unit configured to correct optical axis deviation of the charged particle beam generated by continuously repeating irradiation (beam-ON) of the charged particle beam on a target object and blocking (beam-OFF) of the beam by applying a two-step voltage to the deflector; and
   a control unit configured to control the optical axis adjusting unit such that an amount of the optical axis deviation is corrected.

2. The apparatus according to claim 1, further comprising a memory configured to storing a plurality of control values for controlling the optical axis adjusting unit, wherein an irradiation cycle ratio which is a ratio of a beam-ON time to a beam-OFF time is calculated in advance depending on a resist type, one of the plurality of control values corresponding to the irradiation cycle ratio is read from the memory, and the optical axis adjusting unit is controlled using a one of the plurality of control values when a pattern is formed.

3. The apparatus according to claim 1, further comprising a measuring unit configured to measure current values of the charged particle beam passing through the blocking unit when the beam is turned ON/OFF by repeating the two-step voltage application to the deflector in a predetermined period of time.

4. The apparatus according to claim 1, wherein terminal resistors are attached to the electrodes.

5. The apparatus according to claim 3, wherein the measuring unit measures current values of the charged particle beam reaching the stage while moving a position of the charged particle beam by the optical axis adjusting unit.

6. The apparatus according to claim 3, wherein the control unit outputs a control signal to move an optical axis of the charged particle beam to a position where the current values measured by the measuring unit becomes larger.

7. The apparatus according to claim 1, further comprising a measuring unit configured to measure current values of the charged particle beam reaching the stage when irradiation of the charged particle beam on the stage and blocking of the beam are continuously repeated.

8. The apparatus according to claim 3, wherein the measuring unit has a Faraday cup, and when the charged particle beam is turned ON/OFF, current values of the charged particle beam irradiated on the Faraday cup is measured.

9. The apparatus according to claim 8, wherein the Faraday cup is arranged on the stage.

10. A optical axis deviation correcting method for a charged particle beam, comprising:
    adjusting an optical axis of the charged particle beam in a state in which an application voltage to a blanker having electrodes through which a current flows by applying a voltage is set to a voltage for beam-ON; and
    after the optical axis of the charged particle beam is adjusted, correcting an amount of optical axis deviation of the charged particle beam by adjusting a position of the optical axis while turning ON/OFF the beam by repeating two-step voltage application to the blanker.

* * * * *